(12) United States Patent
Shin

(10) Patent No.: US 7,825,718 B2
(45) Date of Patent: Nov. 2, 2010

(54) PUMPING VOLTAGE DETECTOR

(75) Inventor: Yoon-Jae Shin, Ichon (KR)

(73) Assignee: Hynix Semiconductor Inc. (KR)

( * ) Notice: Subject to any disclaimer, the term of this patent is extended or adjusted under 35 U.S.C. 154(b) by 67 days.

(21) Appl. No.: 12/263,344

(22) Filed: Oct. 31, 2008

(65) Prior Publication Data
US 2009/0201010 A1    Aug. 13, 2009

(30) Foreign Application Priority Data
Feb. 13, 2008    (KR)    ........................ 10-2008-0013145

(51) Int. Cl.
*G05F 1/10*    (2006.01)
(52) U.S. Cl. ........................................... 327/536
(58) Field of Classification Search ............... 327/535, 327/536, 537
See application file for complete search history.

(56) References Cited
U.S. PATENT DOCUMENTS
6,876,246 B2 *    4/2005    Kim ............................ 327/536
7,560,978 B2 *    7/2009    Byeon et al. ................. 327/536
2006/0273844 A1    12/2006    Lee FOREIGN PATENT DOCUMENTS
KR    1020040098159    *    11/2004
KR    1020060018582    *    3/2006

* cited by examiner

*Primary Examiner*—Jeffrey S Zweizig
(74) *Attorney, Agent, or Firm*—Baker & McKenzie LLP (57) ABSTRACT

A pumping voltage detector includes a first division voltage generating unit for dividing a pumping voltage at a first division ratio to generate a first divided voltage, a second division voltage generating unit for dividing the pumping voltage at a second division ratio different from the first division ratio to generate a second divided voltage, and a detection signal generating unit for comparing one of the first and second divided voltages with a reference voltage to generate a pumping voltage detection signal.

16 Claims, 5 Drawing Sheets

PUMPING VOLTAGE DETECTOR

CROSS-REFERENCES TO RELATED APPLICATION

The present application claims priority under 35 U.S.C. §119(a) to Korean application number 10-2008-0013145, filed on Feb. 13, 2008, in the Korean Intellectual Property Office, which is incorporated by reference in its entirety as set forth in full.

BACKGROUND

1. Technical Field

The embodiments described here relate to a semiconductor integrated circuit (IC) and, more particularly, a pumping voltage detector for a semiconductor IC.

2. Related Art

Generally, conventional semiconductor memory apparatus require a pumping voltage VPP during storage or output of data in order to prevent loss of the data. Accordingly, most semiconductor memory apparatus include a pumping voltage generating circuit and a pumping voltage detector, wherein the pumping voltage detecting circuit includes a supply voltage divider and a comparator.

In the pumping voltage detecting circuit, a detection signal instructs voltage pumping during data storage, and must be frequently generated in order to prevent data loss. Thus, the pumping voltage detecting circuit additionally includes a mode setting unit and a sensitivity adjustor that adjusts the sensitivity of the supply voltage divider according to a mode setting result. The sensitivity adjustor provides a signal, which subdivides the supply voltage, to the supply voltage divider in a data storage mode.

For example, the pumping voltage detecting circuit generates the detection signal when a semiconductor memory apparatus is switched from a standby mode or a data output mode to the data storage mode. However, when the semiconductor memory apparatus is substantially switched from the standby mode or the data output mode to the data storage mode, the pumping voltage detecting circuit does not immediately generate the detection signal, and the detection signal is enabled after a predetermined time lapses. Accordingly, if an enable timing of the detection signal is delayed, a data storage operation may be delayed or inadequately performed.

SUMMARY

A pumping voltage detector capable of storing data of a semiconductor memory apparatus without delay is described herein.

In one aspect, a pumping voltage detector includes a first division voltage generating unit for dividing a pumping voltage at a first division ratio to generate a first divided voltage, a second division voltage generating unit for dividing the pumping voltage at a second division ratio different from the first division ratio to generate a second divided voltage, and a detection signal generating unit for comparing one of the first and second divided voltages with a reference voltage to generate a pumping voltage detection signal.

In another aspect, a pumping voltage detector includes an input voltage generator for generating an input voltage by dividing a pumping voltage and producing the input voltage having a level lower than a level of a reference voltage when a semiconductor memory apparatus is switched from one of a standby state and a data output state to a data storage state, and a comparison unit for generating a detection signal by comparing the level of the input voltage with the level of the reference voltage.

In another aspect, a pumping voltage detector includes a first division voltage generating unit for generating an enabled control signal and generating a first divided voltage by dividing a pumping voltage at a first voltage division ratio when a semiconductor memory apparatus is in one of a data output state and a standby state, a second division voltage generating unit for generating a second divided voltage by dividing the pumping voltage at a second voltage division ratio if the control signal is disabled, the second voltage division ratio being less than the first voltage division ratio, and a detection signal generating unit for generating a detection signal by selectively comparing one of the first and second divided voltage with a reference voltage in response to the control signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
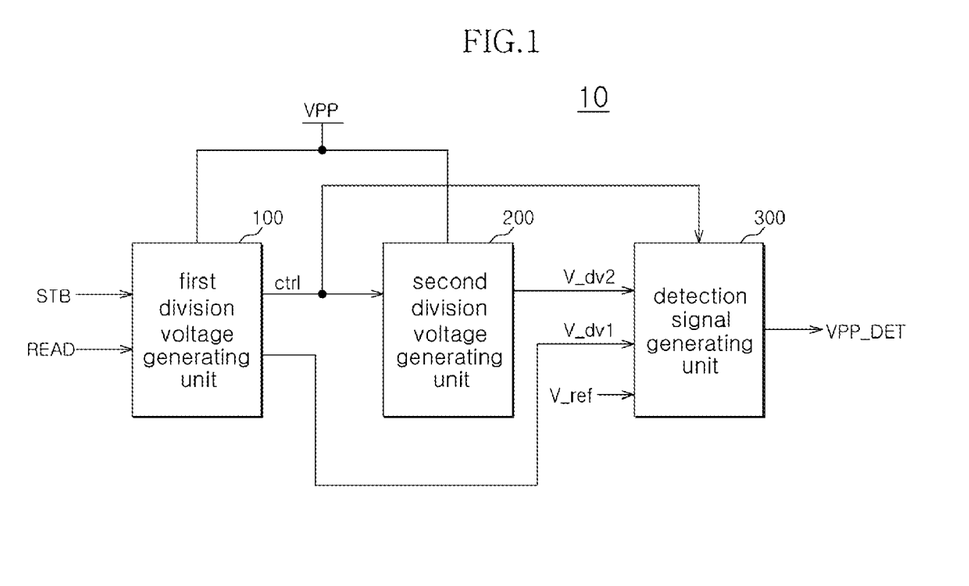
FIG. 1 is a schematic block diagram of an exemplary pumping voltage detecting circuit according to one embodiment.

FIG. 1 is a schematic block diagram schematically of an exemplary pumping voltage detecting circuit according to one embodiment. Referring to FIG. 1, a pumping voltage detecting circuit 10 can be configured to include a first division voltage generating unit 100, a second division voltage generating unit 200, and a detection signal generating unit 300. The first division voltage generating unit 100 can divide a pumping voltage VPP at a first voltage division ratio to generate a first divided voltage V_dv1. In addition, the first division voltage generating unit 100 can generate a control signal 'ctrl' enabled when a semiconductor memory apparatus is in a data output mode, i.e., read mode.

Figure 2:
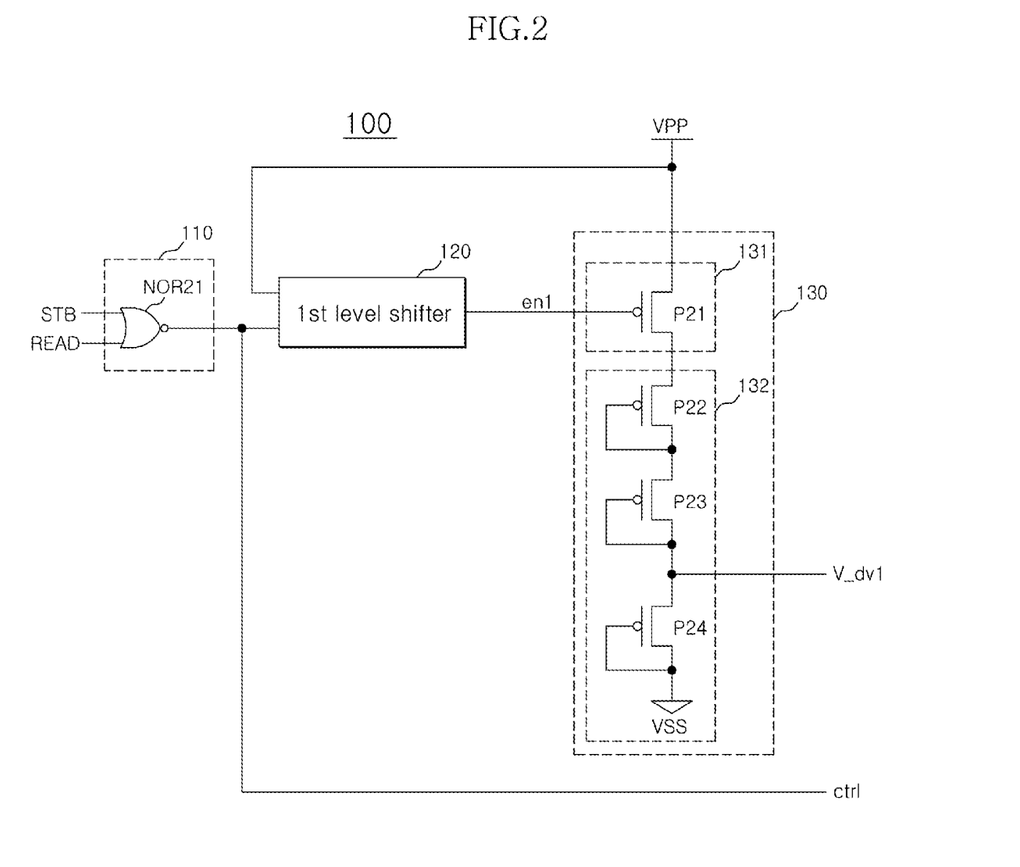
FIG. 2 is a schematic circuit diagram of an exemplary first division voltage generating unit of FIG. 1 according to one embodiment.

FIG. 2 is a schematic circuit diagram of an exemplary first division voltage generating unit of FIG. 1 according to one embodiment. In FIG. 2, the first division voltage generating unit 100 can be configured to include a control signal generating unit 110, a first level shifter 120, and a first voltage divider 130. The control signal generating unit 110 can generate the control signal 'ctrl' enabled at a low level when at least one of a standby signal 'STB' and a read signal 'READ' is enabled. In addition, the control signal generating unit 110 can include a NOR gate NOR21.

The first level shifter 120 can be activated when the control signal 'ctrl' is input at a low level. Accordingly, the activated first level shifter 120 can shift the level of the pumping voltage VPP to generate a first enable signal 'en1'. For example, the first enable signal 'en1' may have a low level.

The first voltage divider 130 can be arranged to include a first switching element 131 and a first divider 132.

The first switching element 131 can be configured to provide the first divider 132 with the pumping voltage VPP according to the first enable signal 'en1'. Accordingly, the first switching element 131 can serve as a voltage transfer unit. For example, the first switching element 131 can be a first transistor P21 (PMOS transistor), and can include a gate terminal for receiving the first enable signal 'en1', a source terminal that can be connected to a pumping voltage terminal, and a drain terminal that can be connected with the first divider 132.

Here, the first divider 132 can be connected between the first switching element 131 and the ground terminal VSS, and can be arranged to include second to fourth PMOS transistors P22 to P24. Accordingly, the first divider 132 can divide the pumping voltage VPP at a first voltage division ratio, i.e., at about 1:3, to generate the first divided voltage V_dv1.

When dividing the pumping voltage VPP at a ratio of about 1:3, the second to fourth PMOS transistors P22 to P24 of the first divider 132 can be configured to function as three serially-connected resistors. Here, the second to fourth resistors P22 to P24 can have substantially the same size, and each can function as a diode through common interconnection of their gate and drain terminals. For example, the second resistor P22 can include a source terminal connected with the first switching element 131, and gate and drain terminals commonly interconnected. The third resistor P23 can include a source terminal connected with the drain terminal of the second resistor P22, and gate and drain terminals commonly interconnected. The fourth resistor P24 can include a source terminal connected with the drain terminal of the third resistor P23, and gate and drain terminals commonly interconnected. Accordingly, the first divided voltage V_dv1 can be output from a node through which the third resistor P23 is connected with the fourth resistor P24.

Figure 3:
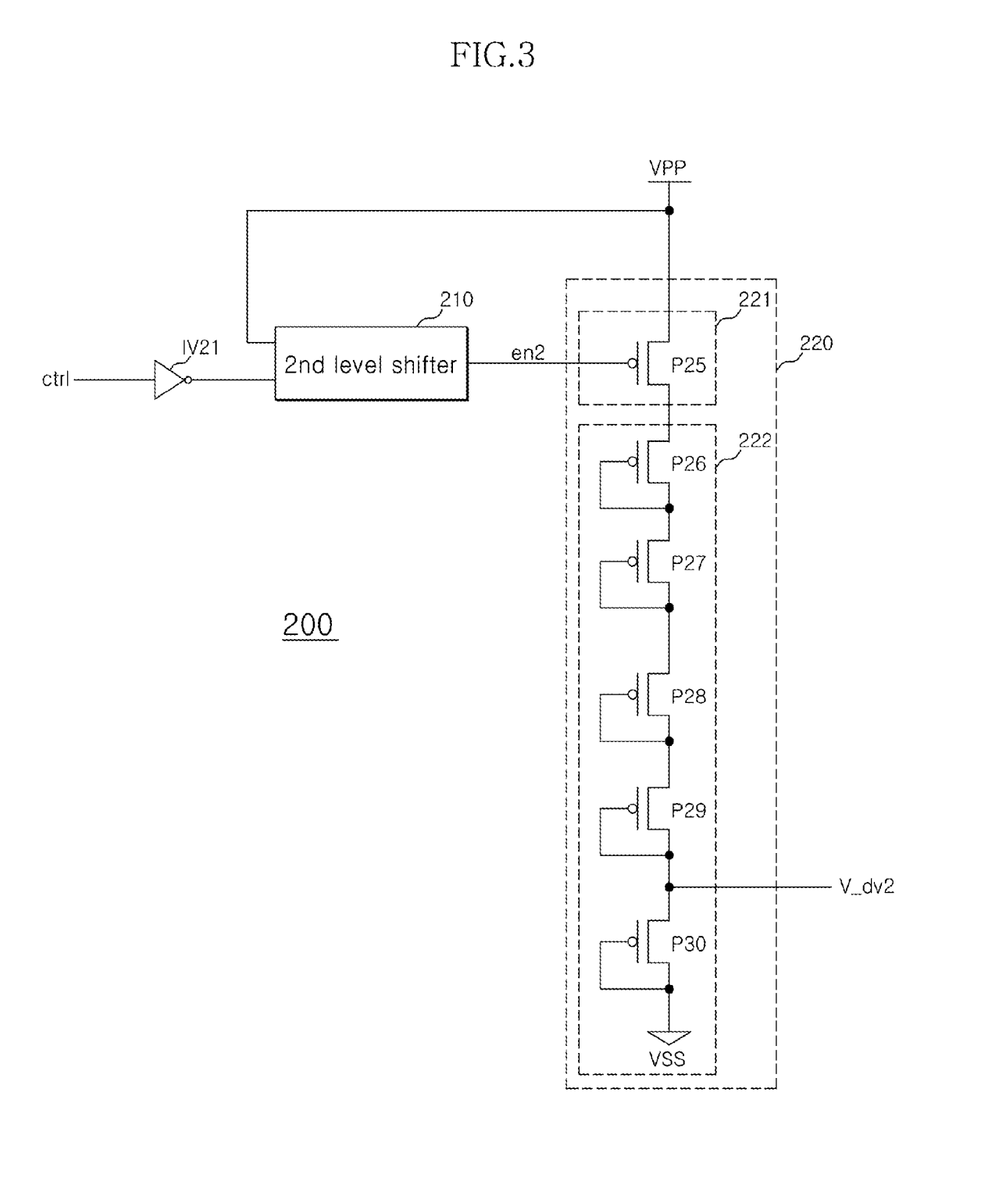
FIG. 3 is a schematic circuit diagram of an exemplary second division voltage generating unit of FIG. 1 according to one embodiment.

FIG. 3 is a schematic circuit diagram of an exemplary second division voltage generating unit of FIG. 1 according to one embodiment. In FIG. 3, a second division voltage generating unit 200 can divide the pumping voltage VPP at a second voltage division ratio to generate second divided voltage V_dv2. The second division voltage generating unit 200 can be configured to include a first inverter IV21, a second level shifter 210, and a second voltage divider 220, wherein the first inverter IV21 can invert the control signal 'ctrl' and the second level shifter 210 can be activated by receiving an output signal of the first inverter IV21. For example, the second level shifter 210 can be activated when the control signal 'ctrl' is disabled at a high level. If the control signal 'ctrl' is input at a high level, then the second level shifter 210 can shift the level of the pumping voltage VPP to generate a second enable signal 'en2' having a low level.

The second voltage divider 220 can receive the second enable signal 'en2' to generate the second divided voltage V_dv2. The second voltage divider 220 can include a second switching element 221 and a second divider 222, wherein the second switching element 221 can provide the second divider 222 with the pumping voltage VPP according to the first enable signal 'en2'. For example, the second switching element 221 may be a fifth transistor P25 (PMOS transistor), and can include a gate terminal for receiving the second enable signal 'en2', a source terminal for receiving the pumping voltage VPP, and a drain terminal connected with the second divider 222.

The second divider 222 can be connected between the second switching element 221 and the ground terminal VSS to generate the second divided voltage V_dv2 using a second division ratio smaller than the first division ratio. Here, the second divider 222 can be configured to include five serially-connected PMOS transistors P26 to P30 having substantially the same size such that the second divider 222 can have the second division ratio of about 1:5. For example, the five PMOS transistor can be configured to function as sixth to tenth resistors P26 to P30. The sixth resistor P26 can have a source terminal connected with an output terminal of the second switching element 221, and drain and gate terminals connected with each other. The seventh resistor P27 can have a source terminal connected with the drain terminal of the sixth resistor P26, and drain and gate terminals connected with each other. The eighth resistor P28 can have a source terminal connected with the drain terminal of the seventh resistor P27, and drain and gate terminals connected with each other. The ninth resistor P29 can have a source terminal connected with the drain terminal of the eighth transistor P28, and drain and gate terminals connected with each other. The tenth resistor P30 can have a source terminal connected with the drain terminal of the ninth resistor P29, and drain and gate terminals connected with each other. Accordingly, the second divided voltage V_dv2 can be output from a node through which the ninth resistor P29 can be connected with the tenth resistor P30.

Figure 4:
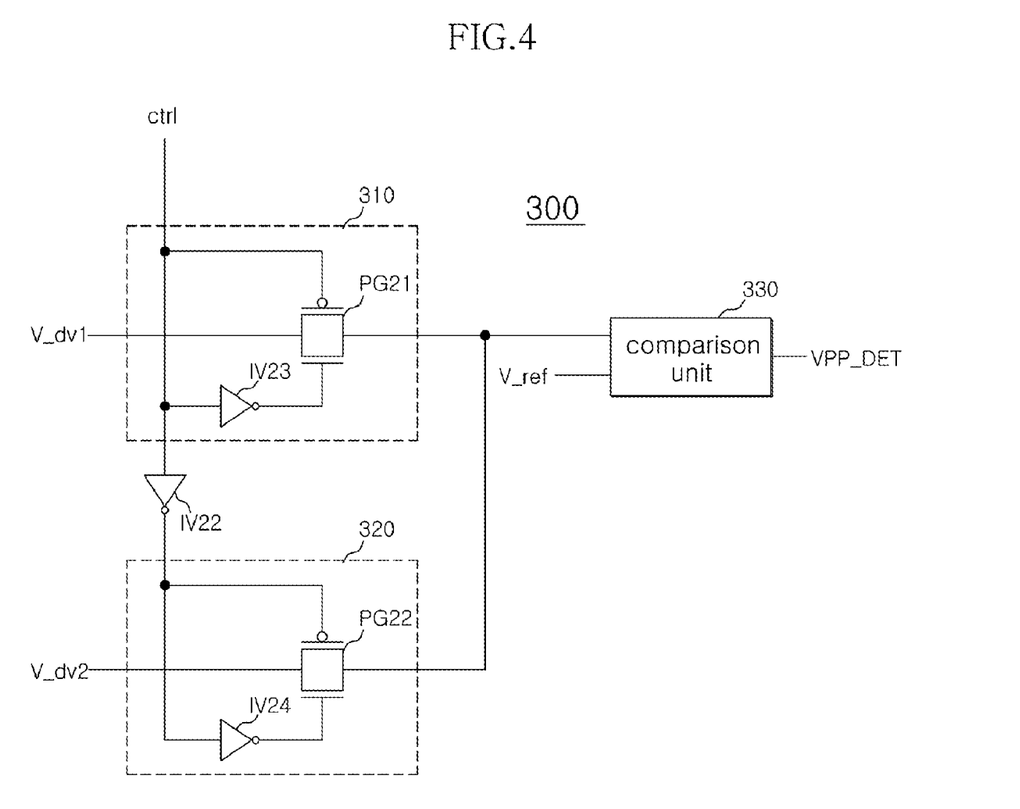
FIG. 4 is a schematic circuit diagram of an exemplary detection signal generating unit of FIG. 1 according to one embodiment.

FIG. 4 is a schematic circuit diagram of an exemplary detection signal generating unit of FIG. 1 according to one embodiment. In FIG. 4, the detection signal generating unit 300 can be configured to include a second inverter IV22, a first switching unit 310, a second switching unit 320, and a comparison unit 330.

The first switching unit 310 can be turned ON if the control signal 'ctrl' is enabled at a low level, thereby applying the first divided voltage V_dv1 to the comparison unit 330. The first switching unit 310 can include a third inverter IV23 and a first pass gate P21, wherein the third inverter IV23 can receive the control signal 'ctrl'. The first pass gate P21 can receive the control signal 'ctrl' through a first control terminal thereof, and can receive an output signal of the third inverter IV23 through a second control terminal thereof. Accordingly, the first pass gate P21 can supply the first divided voltage V_dv1 to the comparison unit 330.

The second inverter IV22 can invert the control signal 'ctrl' to provide the second switching unit 320 with the inverted control signal 'ctrl', wherein the second switching unit 320 can be driven by the control signal 'ctrl' inverted by the second inverter IV22. The second switching unit 320 can be turned ON if the control signal 'ctrl' is disabled at a high level. Then, the second switching unit 320 can supply the second divided voltage V_dv2 to the comparison unit 330.

The second switching unit 320 can include a fourth inverter IV24 and a second pass gate P22, wherein the fourth inverter IV24 can receive an output signal of the second inverter IV22. The second pass gate P22 can receive an output signal of the second inverter IV22 through a first control terminal thereof, and can receive an output signal of the fourth inverter IV24 through a second control terminal thereof. Accordingly, the second pass gate P22 can supply the second divided voltage V_dv2 to the comparison unit 330. Thus, an output terminal of the first switching unit 310 and an output terminal of the second switching unit 320 can be connected with one node connected with the comparison unit 330.

The comparison unit 330 can generate a detection signal 'VPP_DET' by comparing an output signal of the first switching unit 310 or an output signal of the second switching unit 320 with a reference voltage V_ref. For example, the comparison unit 330 can generate the detection signal 'VPP_DET' by comparing a level of the first divided voltage V_dv1 or a level of the second divided voltage V_dv2 with a level of the reference voltage V_ref.

An exemplary method of operation of the pumping voltage detecting circuit for a semiconductor memory apparatus according to one embodiment will be described with reference to FIGS. 1 to 4.

First, the control signal generating unit 110 can generate the control signal 'ctrl' enabled at a low level if at least one of a standby signal 'STB' and a read signal 'READ' is enabled. If the control signal 'ctrl' is enabled at a low level, the first level shifter 120 can be activated to generate the first enable signal 'en1' at a ground level, and can provide the first enable signal 'en1' to the first switching element 131.

At this time, if the first enable signal 'en1' is at the ground level, the first switching element 131 can be turned ON, so that the pumping voltage VPP can be applied to the first divider 132. The first divider 132 can divide the pumping voltage VPP at the first voltage division ratio of about 1:3 to generate the first divided voltage V_dv1.

Conversely, if the control signal 'ctrl' is disabled at a high level, the second level shifter 210 can be activated to provide the second switching element 221 with the second enable signal 'en2' at a ground level. Thus, the second switching element 221 can be turned ON by the second enable signal 'en2' to apply the pumping voltage VPP to the second divider 222.

The second divider 222 can divide the pumping voltage VPP at the second voltage division ratio of about 1:5 to generate the second divided voltage V_dv2. Then, the first divided voltage V_dv1 and the second divided voltage V_dv2 can be input to the detection signal generating unit 300. If the control signal 'ctrl' is enabled at the low level, then the first switching unit 310 can transfer the first divided voltage V_dv1 to the comparison unit 330. If the control signal 'ctrl' is disabled at the high level, the second switching unit 320 can transfer the second divided voltage V_dv2 to the comparison unit 330.

The comparison unit 330 can generate the detection signal VPP_DET by comparing the first divided voltage V_dv1 or the second divided voltage V_dv2 with the reference voltage V_ref. When the control signal 'ctrl' is enabled and then disabled, i.e. the semiconductor memory apparatus is switched from a standby state or a data output state to a data storage state, the comparison unit 330 can receive the second divided voltage V_dv2 instead of the first divided voltage V_dv1.

Hereinafter, an exemplary voltage level applied to a first input terminal of the comparison unit 330 will be described. The comparison unit 330 can receive the voltage corresponding to about one-third of the level of the pumping voltage VPP, and can receive the voltage having a level lower than that of the reference voltage V_ref. Then, the comparison unit 330 can receive the voltage corresponding to about one-fifth of the level of the pumping voltage VPP. This is because the first switching unit 310 of FIG. 4 is turned OFF and the second switching unit 320 is turned ON when the control signal 'ctrl' is disabled in an enabled state. Thus, the first input terminal of the comparison unit 330 can maintain a potential level corresponding to about one-third of the level of the pumping voltage VPP, and can have a level less than that of the reference voltage V_ref when the second switching unit 320 is turned ON.

Simultaneously, or at least nearly simultaneously, the first input terminal of the comparison unit 330 can be connected with the source terminal of the tenth resistor/transistor P30. Accordingly, when the second switching unit 320 can be turned ON, the first input terminal of the comparison unit 330 can have a potential level lower than a level of the reference voltage V_ref. If the pumping voltage VPP is applied to the second divider 222 and current is applied to the tenth resistor/transistor P30 via the sixth to ninth resistors/transistors P26 to P29, then the second divided voltage V_dv2, which has a level corresponding to about one-fifth of that of the pumping voltage VPP, can be applied to the first input terminal of the comparison unit 330.

Consequently, the pumping voltage detecting circuit for a semiconductor memory apparatus according to one embodiment can enable the detection signal 'VPP_DET' without time delay when the semiconductor memory apparatus is switched from the standby state or the data output state to the data storage state.

Figure 5:
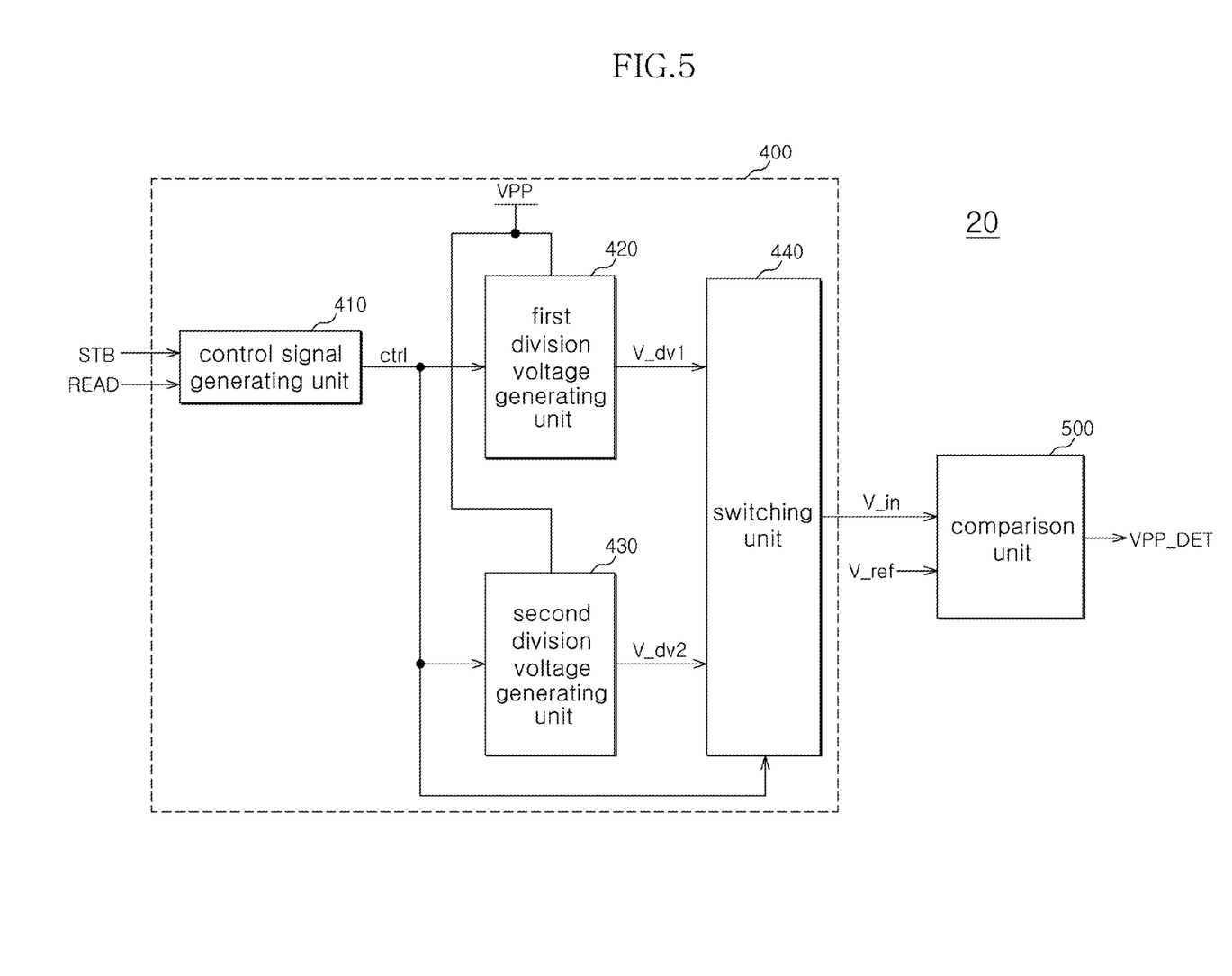
FIG. 5 is a schematic block diagram of another exemplary pumping voltage detecting circuit according to another embodiment.

FIG. 5 is a schematic block diagram of another exemplary pumping voltage detecting circuit according to another embodiment. In FIG. 5, the pumping voltage detecting circuit 20 can be configured to include an input voltage generator 400 and a comparison unit 500.

The input voltage generator 400 can generate an input voltage V_in in response to a standby signal 'STB' and a read signal 'READ' by dividing a pumping voltage VPP to generate the input voltage V_in. For example, the input voltage generator 400 can generate the input voltage V_in having a level lower than that of the reference voltage V_ref when the standby signal 'STB' and the read signal 'READ' are disabled in a state in which one of the standby signal 'STB' and the read signal 'READ' is enabled.

The input voltage generator 400 can be configured to include a control signal generating unit 410, a first division voltage generating unit 420, a second division voltage generating unit 430, and a switching unit 440. The control signal generating unit 410 and the first division voltage generating unit 420 can have configurations similar to that shown in FIG. 2, for example. The second division voltage generating unit 430 can have a configuration similar to that shown in FIG. 3, for example. The switching unit 440 can have a configuration similar to that of the first or second switching unit 310 or 320, as shown in FIG. 4, for example.

The control signal generating unit 410 can generate a control signal 'ctrl' enabled when at least one of the standby signal 'STB' and the read signal 'READ' is enabled. If the control signal 'ctrl' is enabled, then the first division voltage generating unit 420 can divide the pumping voltage VPP at a first voltage division ratio of about 1:3 to generate first divided voltage V_dv1. Conversely, if the control signal 'ctrl' is disabled, then the second division voltage generating unit 430 can divide the pumping voltage VPP at a second voltage division ratio of about 1:5 to generate second divided voltage V_dv2.

If the control signal 'ctrl' is enabled, then the switching unit 440 can output the first divided voltage V_dv1 as the input voltage V_in. Conversely, if the control signal 'ctrl' is disabled, then the switching unit 440 can output the second divided voltage V_dv2 as the input voltage V_in. When the input voltage V_in is changed from the first divided voltage V_dv1 to the second divided voltage V_dv2, the switching unit 440 can connect a node, through which the input voltage V_in is applied to comparison unit 500, with the second division voltage generating unit 430. Accordingly, a potential level of the input voltage V_in can be reduced to a level less than a level of the reference voltage V_ref from a level of the first divided voltage V_dv1, and then changed to a level of the second divided voltage V_dv2 from the level of the reference voltage V_ref. Thus, the comparison unit 500 can generate a detection signal 'VPP_DET' by comparing the level of the input voltage V_in with the level of the reference voltage V_ref.

The present embodiments can enable the detection signal, which is used to generate the pumping voltage, without time delay when a semiconductor memory apparatus is switched from a standby state or a data output state to a data storage state. Thus, when a semiconductor memory apparatus is switched from a standby state or a data output state to a data storage state, the semiconductor memory apparatus can perform a pumping operation to normally store data without a delay time, whereby the semiconductor memory apparatus can perform high speed operations.

While certain embodiments have been described above, it will be understood that the embodiments described are by way of example only. Accordingly, the apparatuses and method described herein should not be limited based on the described embodiments. Rather, the apparatuses and methods described herein should only be limited in light of the claims that follow when taken in conjunction with the above description and accompanying drawings.

What is claimed is:

1. A pumping voltage detector, comprising:
   a first division voltage generating unit configured to divide a pumping voltage at a first division ratio to generate a first divided voltage;
   a second division voltage generating unit configured to divide the pumping voltage at a second division ratio being less than the first division ratio to generate a second divided voltage; and
   a detection signal generating unit configured to compare one of the first and second divided voltages with a reference voltage to generate a pumping voltage detection signal,
   wherein the second divided voltage is less than the reference voltage.

2. The pumping voltage detector of claim 1, wherein the first division voltage generating unit is driven in a first mode and the second division voltage generating unit is driven in a second mode different from the first mode.

3. The pumping voltage detector of claim 2, wherein the first mode is one of a data output mode and a standby mode, and the second mode is a data storage mode.

4. The pumping voltage detector of claim 1, further comprising a control signal generating unit configured to generate a control signal to drive the first and second division voltage generating units.

5. The pumping voltage detector of claim 4, wherein the control signal generating unit generates the control signal enabled when one of a standby signal and a read signal is enabled.

6. The pumping voltage detector of claim 4, wherein the control signal generating unit is disposed within the first division voltage generating unit.

7. The pumping voltage detector of claim 4, wherein the first division voltage generating unit includes:
   a level shifter configured to receive the enabled control signal to selectively shift a level of the pumping voltage; and
   a first voltage divider configured to generate the first divided voltage by dividing the pumping voltage at the first division ratio according to an output signal of the level shifter.

8. The pumping voltage detector of claim 7, wherein the first voltage divider includes:

a first switching element configured to selectively transfer the pumping voltage according to the output signal of the level shifter; and
a first divider configured to divide the pumping voltage that is applied from the first switching element, at the first division ratio,
wherein the first divider includes a plurality of serially-connected resistors between an output terminal and a ground terminal of the first switching element.

9. The pumping voltage detector of claim 4, wherein the second division voltage generating unit includes:
   a level shifter configured to shift a level of the pumping voltage when a disabled control signal is input; and
   a second voltage divider configured to generate the second divided voltage by dividing the pumping voltage at the second division ratio according to an output signal of the level shifter.

10. The pumping voltage detector of claim 9, wherein the second voltage divider includes:
    a second switching element configured to transfer the pumping voltage according to the output signal of the level shifter; and
    a second divider configured to divide the pumping voltage that is transferred from the second switching element, at the second division ratio,
    wherein the second divider includes a plurality of serially-connected resistors between an output terminal and a ground terminal of the second switching element, and wherein a total number of the plurality of resistors of the second divider is greater than a total number of the plurality of resistors in a first divider of the first divisional voltage generating unit.

11. The pumping voltage detector of claim 4, wherein the detection signal generating unit generates the detection signal by comparing a level of the first divided voltage with a level of the reference voltage if the control signal is enabled, and generates the detection signal by comparing a level of the second divided voltage with the level of the reference voltage if the control signal is disabled.

12. The pumping voltage detector of claim 11, wherein the detection signal generating unit includes:
    a comparison unit configured to generate the detection signal by comparing a level of voltage that is input to an input terminal thereof with the level of the reference voltage;
    a first switching unit configured to supply the first divided voltage to the input terminal when the control signal is enabled; and
    a second switching unit configured to supply the second divided voltage to the input terminal when the control signal is disabled.

13. A pumping voltage detector, comprising:
    a first division voltage generating unit configured to generate an enabled control signal and generating a first divided voltage by dividing a pumping voltage at a first voltage division ratio when a semiconductor memory apparatus is in one of a data output state and a standby state;
    a second division voltage generating unit configured to generate a second divided voltage by dividing the pumping voltage at a second voltage division ratio if the control signal is disabled, the second voltage division ratio being less than the first voltage division ratio; and
    a detection signal generating unit configured to generate a detection signal by selectively comparing one of the first and second divided voltage with a reference voltage in response to the control signal, wherein the second divided voltage is less than the reference voltage.

14. The pumping voltage detector of claim 13, further comprising a control signal generating unit configured to generate the enabled control signal when one of a standby signal and a read signal is enabled.

15. The pumping voltage detector of claim 13, wherein the first division voltage generating unit includes:
   a voltage divider connected with a voltage terminal and a ground terminal; and
   a voltage applying unit configured to supply the pumping voltage to the voltage terminal if the control signal is enabled,
   wherein the voltage divider generates the first divided voltage by dividing the voltage that is supplied to the voltage terminal at the first voltage division ratio.

16. The pumping voltage detector of claim 13, wherein the second division voltage generating unit includes:
   a voltage divider connected with a voltage terminal and a ground terminal; and
   a voltage applying unit configured to supply the pumping voltage to the voltage terminal if the control signal is disabled,
   wherein the voltage divider generates the second divided voltage by dividing the voltage that is applied to the voltage terminal at the second voltage division ratio.

* * * * *